United States Patent
Mishra et al.

(10) Patent No.: US 7,126,426 B2
(45) Date of Patent: Oct. 24, 2006

(54) CASCODE AMPLIFIER STRUCTURES INCLUDING WIDE BANDGAP FIELD EFFECT TRANSISTOR WITH FIELD PLATES

(75) Inventors: Umesh Mishra, Santa Barbara, CA (US); Primit Parikh, Goleta, CA (US); Yifeng Wu, Goleta, CA (US)

(73) Assignee: Cree, Inc., Goleta, CA (US)

( * ) Notice: Subject to any disclaimer, the term of this patent is extended or adjusted under 35 U.S.C. 154(b) by 21 days.

(21) Appl. No.: 10/856,098

(22) Filed: May 28, 2004

(65) Prior Publication Data

US 2005/0051800 A1    Mar. 10, 2005

Related U.S. Application Data

(60) Provisional application No. 60/501,628, filed on Sep. 9, 2003.

(51) Int. Cl.
*H03F 3/14* (2006.01)
*H03F 1/22* (2006.01)

(52) U.S. Cl. ..................... 330/307; 330/311
(58) Field of Classification Search ............... None
See application file for complete search history.

(56) References Cited

U.S. PATENT DOCUMENTS

| | | | | |
|---|---|---|---|---|
| 4,659,979 A * | 4/1987 | Burnham et al. | ............ | 257/525 |
| 5,192,987 A | 3/1993 | Khan et al. | ............ | 257/183.1 |
| 5,229,665 A * | 7/1993 | Jemison et al. | ............ | 327/553 |
| 5,926,069 A * | 7/1999 | Ko et al. | ............ | 330/311 |
| 6,362,036 B1 * | 3/2002 | Chiozzi et al. | ............ | 438/206 |
| 2001/0015446 A1 | 8/2001 | Inoue et al. | | |
| 2002/0005528 A1 | 1/2002 | Nagahara | | |
| 2002/0017648 A1 | 2/2002 | Kasahara et al. | | |
| 2003/0006437 A1 | 1/2003 | Mizuta et al. | | |

FOREIGN PATENT DOCUMENTS

WO    WO 2004068590 A1    8/2004

OTHER PUBLICATIONS

CRC Press, *The Electrical Engineering Handbook*, Second Edition, Dorf, (1997) p. 994.
B. Gelmont, K. Kim, and M. Shur. "Monte Carlo Simulation of Electron Transport in Gallium Nitrate." *Journal of Applied Physics*, vol. 74, Issue 3, (Aug. 1, 1993) p. 1818.
R. Gaska, J.W. Yang, A. Osinsky, Q. Chen, M.A. Khan, A.O. Orlov, G.L. Snider, M.S. Shur. "Electron Transport in ALGaN Heterostructures Grown on 6H-SiC Substrates." *Applied Physics Letters*, vol. 72, No. 6 (Feb. 9, 1998) p. 707.
Y. F. Wu et. al. "GaN-Based FETs for Microwave Power Amplification." *IEICE Transactions on Electronics*, E-82-C, (1999) p. 1895.

(Continued)

*Primary Examiner*—Khanh Van Nguyen
(74) *Attorney, Agent, or Firm*—Koppel, Patrick & Heybl (57) ABSTRACT

A multi-stage amplifier circuit arranged to take advantage of the desirable characteristics of non-field-plate and field plate transistors when amplifying a signal. One embodiment of a multi-stage amplifier according to the present invention comprises a non-field-plate transistor and a field-plate transistor. The field-plate transistor has at least one field plate arranged to reduce the electric field strength within the field plate transistor during operation. The non-field plate transistor is connected to the field plate transistor, with the non-field-plate providing current gain and the field plate transistor providing voltage gain. In one embodiment the non-field-plate and field plate transistors are coupled together in a cascode arrangement.

23 Claims, 4 Drawing Sheets

OTHER PUBLICATIONS

Y.F. Wu, D. Kapolnek, J.P. Ibettson, P. Parikh, B.P. Keller, and U.K. Mishra. "Very-High Power Density ALGaN/GaN HEMTS." *IEEE Transactions on Electronic Devices*, vol. 48, Issue 3 (Mar. 2001) p. 586.

M. Micovic, A. Kurdoghlian, P. Janke, P. Hashimoto, D.W.S. Wong, J. S. Moon, L. McRay, and C. Nguyen. "ALGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001) p. 591.

Gaska et al., "Hightemperature Perofrmance of ALGaN/GaN HFET's on SiC Substrates." *IEEE Electron Device Letters* vol. 18, No. 10, (Oct. 1997) p. 492.

Ping et al., "DC and Microwave Performance of High Current ALGaN Heterostructure Field Effect Transistors Grown on P-Type SiC Substrates." *IEEE Electron Device Letters* vol. 19, No. 2, (Feb. 1998) p. 54.

L. Eastman, K. Chu, J. Smart, J. R. Shealy, "GaN Materials for High Power Microwave Amplifiers." *Materials Research Society* vol. 512 Wocsemmad, Monterey, CA (Feb. 1998) p. 3-7.

G. Sullivan et al., "High Power 10-GHz Operation of ALGaN HFET's in Insulating SiC." *IEEE Electron Device Letters* vol. 19, No. 6, (Jun. 1998) p. 198.

Wu et al., "High Al-Content ALGaN/GaN MODFETs for Ultrhigh Performance." *IEEE Electron Device Letters* vol. 19, No. 2, (Feb. 1998) p. 50.

Y. Ando, et al., "10-W/mm ALGaN-GaN HFET With a Field Modulating Plate." *IEEE Electron Device Letters* vol. 24, No. 5, (May 2003) p. 289-292.

S. Karmalkar, U.K. Mishra, "Very High Voltage ALGaN/GaN High Electron Mobility Transistors Using a Field Plate Deposited on a Stepped Insulator." *Solid-State Electronics* vol. 45, (2001) pp. 1645-1652.

W. Saito et al., "600V ALGaN/GaN Power-HEMT: Design, Fabrication and Demonstration on High Voltage DC-DC Converter." *IEEE IEDM* vol. 23, No. 7, (2003) pp. 587-590.

Asano K et al: "Novel High Power AlGaAs/GaAs HFET With a Field-Modulating Plate Operated at 35 V Drain Voltage", Electron Devices Meeting, 1998. IDM '98 Technical Digest. International San Francisco, CA USA Dec. 6-9, 1998, Piscataway, NJ, USA IEEE US, pp. 59-62 XP010321500.

Wakejima A et al, "High Power Density and Low Distortion INGAP Channel FETS with Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.

Mok P K T et al, "A Novel High-Voltage High-Speed MESFET Using a Standard GAAS Digital IC Process" IEEE Transactions on Electron Devices, IEEE Inc. New York, US. vol. 41, No. 2, Feb. 1, 1994, pp. 246-250, XP000478051.

Karmalkar S. et al. "Very High Voltage AlGaN/GaN High Electron Mobility Transistors Using a Field Plate Deposited on a Stepped Insulator" Solid State Electronics, Elsevier Science Publishers, Barking, GB, vol. 45, No. 9, Sep. 2001, pp. 1645-1652, XP004317729.

Li J, et al "High Breakdown Voltage GaN HFET With Field Palte" Electronics Letters, IEE Stevenage, GB vol. 37, No. 3, Feb. 1, 2001, pp. 196-197, XP006016221.

Xing H. et al. "High Breakdown Voltage Algan-Gan HEMTS Achieved by Multiple Field Plates" IEEE Electron Device Letters, IEEE Inc. New York, US. vol. 25, No. 4, Apr. 2004, pp. 161-163, XP001190361.

\* cited by examiner

CASCODE AMPLIFIER STRUCTURES INCLUDING WIDE BANDGAP FIELD EFFECT TRANSISTOR WITH FIELD PLATES

This application claims the benefit of provisional application Ser. No. 60/501,628 to Parikh et al., which was filed on Sep. 9, 2003.

BACKGROUND OF THE INVENTION

1. Field of the Invention

The present invention relates to transistors and particularly to amplifier circuits utilizing field plated transistors.

2. Description of the Related Art

High electron mobility transistors (HEMTs) are a common type of solid state transistor that are regularly fabricated from semiconductor materials such as Silicon (Si) or Gallium Arsenide (GaAs). One disadvantage of Si is that it has low electron mobility (approximately 1450 $cm^2$/V-s), which produces a high source resistance. This resistance can degrade the Si based HEMT's high performance gain. [CRC Press, *The Electrical Engineering Handbook*, Second Edition, Dorf, p.994, (1997)]

GaAs based HEMTs have become the standard for signal amplification in civil and military radar, handset cellular, and satellite communications. GaAs has a higher electron mobility (approximately 6000 $cm^2$/V-s) and a lower source resistance than Si, which allows GaAs based devices to function at higher frequencies. However, GaAs has a relatively small bandgap (1.42 eV at room temperature) and relatively small breakdown voltage, which prevents GaAs based HEMTs from providing high power at high frequencies.

Improvements in the manufacturing of AlGaN/GaN semiconductor materials have focused interest on the development of AlGaN/GaN HEMTs for high frequency, high temperature and high power applications. AlGaN/GaN has large bandgaps, high peak and saturation electron velocity values [B. Belmont, K. Kim and M. Shur, *J. Appl. Phys.* 74, 1818 (1993)]. AlGaN/GaN HEMTs can also have 2DEG sheet densities in excess of $10^{13}/cm^2$ and relatively high electron mobility (up to 2019 $cm^2$/Vs) [R. Gaska, J. W. Yang, A. Osinsky, Q. Chen, M. A. Khan, A. O. Orlov, G. L. Snider and M. S. Shur, *Appl. Phys. Lett.*, 72, 707 (1998)]. These characteristics allow AlGaN/GaN HEMTs to provide high power at higher frequencies.

AlGaN/GaN HEMTs have been grown on sapphire substrates and have shown a power density of 4.6 W/mm and a total power of 7.6 W [Y. F. Wu et al., *IEICE Trans. Electron.*, E-82-C, 1895 (1999)]. More recently, AlGaN/GaN HEMTs grown on SiC have shown a power density of 9.8 W/mm at 8 GHz [Y. F. Wu, D. Kapolnek, J. P. Ibbetson, P. Parikh, B. P. Keller and U. K. Mishra, *IEEE Trans. Electron. Dev.*, 48, 586 (2001)] and a total output power of 22.9 at 9 GHz [M. Micovic, A Kurdoghlian, P. Janke, P. Hashimoto, D. W. S. Wong, J. S. Moon, L. McCray and C. Nguyen, *IEEE Trans. Electron. Dev.*, 48, 591 (2001)].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., "High-Temperature Performance of AlGaN/GaN HFET's on SiC Substrates," *IEEE Electron Device Letters*, Vol. 18, No 10, October 1997, Page 492; and Ping et al., "DC and Microwave Performance of High Current AlGaN Heterostructure Field Effect Transistors Grown on P-type SiC Substrates," *IEEE Electron Devices Letters*, Vol. 19, No. 2, February 1998, Page 54. Some of these devices have shown a gain-bandwidth product ($f_T$) as high as 67 gigahertz [K. Chu et al. WOCSEMMAD, Monterey, Calif. (February 1998)] and high power densities up to 2.84 W/mm at 10 GHz [G. Sullivan et al., "High Power 10-GHz Operation of AlGaN HFET's in Insulating SiC," *IEEE Electron Device Letters*, Vol. 19, No. 6, Page 198 (June 1998); and Wu et al., IEEE Electron Device Letters, Volume 19, No. 2, Page 50 (February 1998)].

Electron trapping and the resulting difference between DC and RF characteristics have been a limiting factor in the performance of GaN based transistors, such AlGaN/GaN HEMTs. Silicon Nitride (SiN) passivation has been successfully employed to alleviate this trapping problem resulting in high performance devices with power densities over 10 W/mm at 10 Ghz. U.S. Pat. No. 6,586,781 discloses methods and structures for reducing the trapping effect in GaN-based transistors. However, due to the high electric fields existing in these structures, charge trapping is still an issue.

SUMMARY OF THE INVENTION

The present invention provides multiple staged amplifier circuits that take advantage of the desirable operating characteristics of non-field-plated transistors and field plated transistors to achieve efficient high power and high frequency signal amplification.

One embodiment of a multi-stage amplifier block according to the present invention comprises a first stage transistor arranged to provide current gain. A second stage transistor having a field plate is included with the first transistor coupled to the second transistor and the second transistor providing voltage gain.

One embodiment of a multi-stage amplifier according to the present invention comprises a non-field-plate transistor and a field-plate transistor having at least one field plate arranged to reduce the electric field strength within the field plate transistor during operation. The non-field plate transistor is connected to the field plate transistor.

One embodiment of an amplifier circuit according to the present invention comprises a first transistor having a common source configuration and arranged to accept a signal at its gate and provide a current amplified signal at its drain. A second transistor having a common gate configuration is included and arranged to accept the current amplified signal at its source and provide a voltage amplified signal at its drain. The second transistor further comprises a field plate arranged to reduce the electric field strength within the second transistor during operation.

These and other further features and advantages of the invention would be apparent to those skilled in the art from the following detailed description, taking together with the accompanying drawings, in which:

BRIEF DESCRIPTION OF THE DRAWINGS

FIG; 7 is a graph showing the performance of certain HEMTs arranged according to the present invention.

DETAILED DESCRIPTION OF THE INVENTION

Multi-stage amplifier blocks according to the present invention combine the strengths of field plated and non-field-plated transistors. Field plated transistors can suffer from added capacitance (e.g. feedback) that can negatively impact overall performance. To address this an amplifier block is provided, preferably in a cascode arrangement, having at least two stages. One of the initial stages does not suffer from feedback capacitance and a downstream field plated stage is arranged in such a way that any added capacitance from a field plate only minimally impacts performance. Hence the multi-stage amplification block obtains the benefits of the field plate without detrimental impact on the overall gain of the amplifier block.

As more fully described below, one embodiment of an amplifier block according to the present invention comprises a 2-stage cascode arrangement including a first stage transistor connected in common source configuration and a second stage transistor in common gate configuration. The drain of the first stage transistor is connected to the source of the second stage transistor. The first stage transistor can comprise a wide bandgap field effect transistor such as a GaN-based HEMT structure or a SiC MESFET. The second stage transistor can comprise a wide bandgap field effect transistor structure such as a GaN-based HEMT or a SiC MESFET having a field plate extending above a spacer layer from the edge of the gate contact towards the drain contact. Embodiments of the invention provide an amplifier capable of simultaneous high gain and high power operation.

Many different wide bandgap transistor structures can be used in the cascode amplifier arrangement and generally include a channel layer with metal source and drain contacts formed in electrical contact with the channel layer. A gate contact is formed between the source and drain contacts for modulating electric fields within the channel. A spacer layer is formed above the channel layer. The spacer layer may comprise a dielectric layer, a layer of undoped or depleted wide bandgap material, or a combination thereof. A conductive field plate is formed above the spacer layer and extends a distance $L_f$ from the edge of the gate contact towards the drain contact.

The field plate can be electrically connected to the gate contact and in some embodiments the field plate is formed as an extension of the gate contact while in other embodiments the field plate and gate electrode are formed during separate deposition steps. In still other embodiments the field gate can be connected to the source contact. This field plate arrangement can reduce the peak electric field in the device that can result in increased breakdown voltage and reduced trapping. The reduction of the electric field can also yield other benefits such as reduced leakage currents and enhanced reliability.

Figure 1:
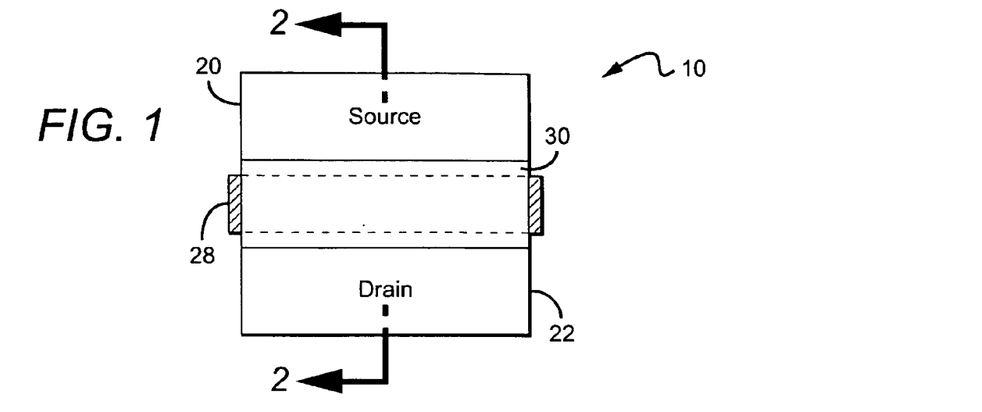
FIG. 1 is a plan view of one embodiment of a HEMT according to the present invention.
Figure 2:
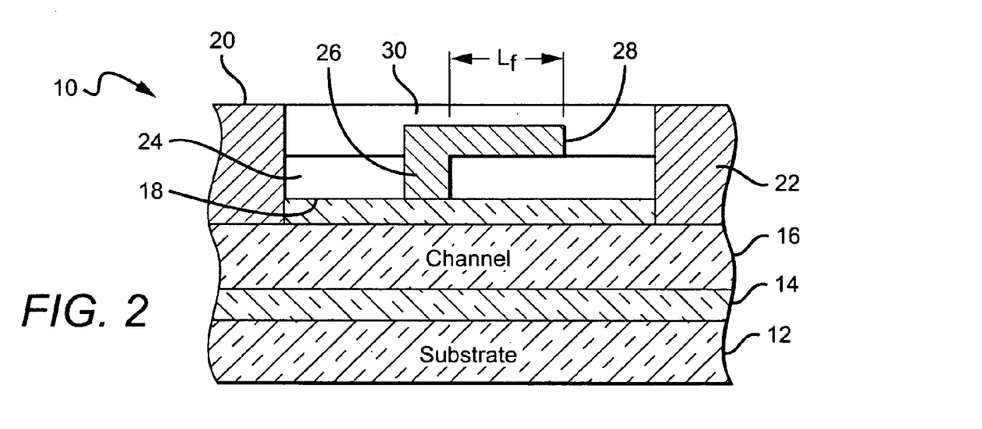
FIG. 2 is a sectional view of the HEMT in FIG. 1.

FIGS. 1 and 2 show one embodiment of a nitride based HEMT 10 according to the present invention which can be used in the cascode amplifier arrangement according to the present invention. The HEMT 10 comprises a substrate 12 which can be made of silicon carbide, sapphire, spinet, ZnO, silicon, gallium nitride, aluminum nitride, or any other material capable of supporting growth of a Group-III nitride material. In some embodiments, the substrate 12 can comprise semi-insulating 4H-SiC commercially available from Cree, Inc. of Durham, N.C.

A nucleation layer 14 can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ (0<=z<=1). On one embodiment according to the present invention the nucleation layer comprises AlN ($Al_zGa_{1-z}N$, z=1). Nucleation layer 14 can be formed on the substrate 12 using known semiconductor growth techniques such as MOCVD, HVPE or MBE.

The formation of a nucleation layer 14 can depend on the material used for the substrate 12. For example, methods of forming a nucleation layer 14 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further comprises a high resistivity channel layer 16 formed on the nucleation layer 14, with a suitable channel layer 16 made of a Group III-nitride material such as $Al_xGa_yIn_{(1-x-y)}N$ (0<=x<=1, 0<=y<=1, x+y<=1). In another embodiment according to the present invention the channel layer 16 comprises a layer a GaN:Fe that is approximately 2 μm thick. In a finally constructed HEMT, a typical channel layer 16 comprises is high resistivity (buffer) material with a two dimensional electron gas (2-DEG) formed at its top surface as more fully described below.

A buffer layer 18 is formed on the channel layer 16 such that the channel layer 16 is sandwiched between the barrier layer 18 and the nucleation layer 14. Each of the channel layer 16 and barrier layer 18 can comprise doped or undoped layers of Group III-nitride materials. In one embodiment the barrier layer comprises 0.8 nm of AlN and 22.5 nm of $Al_xGa_{1-x}N$ (x=1.195, as measured by PL). Exemplary structures are illustrated in U.S. Pat. Nos. 6,316,793, 6,586,781, 6,548,333 and U.S. Published Patent Application Nos. 2002/0167023 and 2003/00020092 each of which is incorporated by reference as though fully set forth herein. Other nitride based HEMT structures are illustrated in U.S. Pat. Nos. 5,192,987 and 5,296,395 each of which is incorporated herein by reference as if fully set forth herein. The channel and barrier layers 16, 18 can be made using the same methods used to grow the nucleation layer 14. Electric isolation between the devices is done with mesa etch or ion implementation outside the active HEMT.

Metal source and drain contacts 20, 22 are formed making ohmic contact through the barrier layer 18. A spacer layer 24 can be formed on the surface of the barrier layer 18 between the source and drain contacts 20, 22. The spacer layer 24 can comprise a layer of non-conducting material such as a dielectric, or a number of different layers of non-conducting materials such as different dielectrics. The spacer layer can be many different thicknesses, with a suitable range of thicknesses being approximately 0.05 to 0.5 microns.

The spacer layer 24 can be etched to the barrier layer 18 and a gate electrode 26 deposited such that the bottom of the gate electrode 26 is on the surface of barrier layer 18. The metal forming the gate electrode may be patterned to extend across spacer layer 24 so that the top of the gate 26 forms a field plate structure 28 extending a distance $L_f$ away from the edge of gate 26 towards drain 22. Stated differently, the part of the gate metal resting on the spacer layer 24 forms a field plate 28. Finally, the structure can be covered with a dielectric passivation layer 30 such as silicon nitride. Methods of forming the dielectric passivation 30 are described in detail in the patents and publications referenced above.

Electric current can flow between the source and drain contacts 20, 22 through a two-dimensional electron gas (2DEG) induced at the heterointerface between the channel layer 16 and the barrier layer 18 when the gate 26 is biased at the appropriate level. The source and drain contacts 20, 22 can be made of different materials including but not limited to alloys of titanium, aluminum, gold or nickel. The gate 26 can also be made of different materials including but not limited to gold, nickel, platinum, titanium, chromium, alloys of titanium and tungsten, or platinum silicide. The gate 26 can have many different lengths, with a suitable range of gate lengths being 0.01 to 2 microns. In one embodiment according to the present invention a preferred gate length ($L_g$) is approximately 0.5 microns. In other embodiments according to the present invention the gate 26 can be at least partially recessed in barrier layer 18. In some embodiments, the field plate 28 is formed during the same deposition step as an extension of the gate 26. In other embodiments, the field plate 28 and gate 26 are formed during separate deposition steps. The formation of source and drain ohmic contacts 20, 22 is described in detail in the patents and publications referenced above.

The first field plate 28 can extend different distances $L_f$ over the barrier layer from the edge of the gate 26 with a suitable range of distances being 0.1 to 1.5 microns, although other distances can also be used. The field plate 28 can comprise many different conductive materials with a suitable material being a metal deposited using standard metallization methods. In one embodiment according to the present invention the field plate 28 comprises the same metal as the gate 26.

Figure 3:
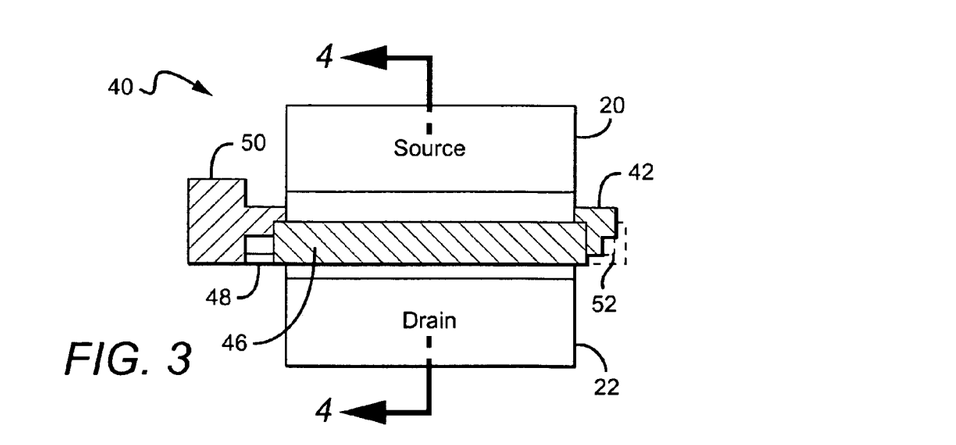
FIG. 3 is a plan view of another embodiment of a HEMT according to the present invention.
Figure 4:
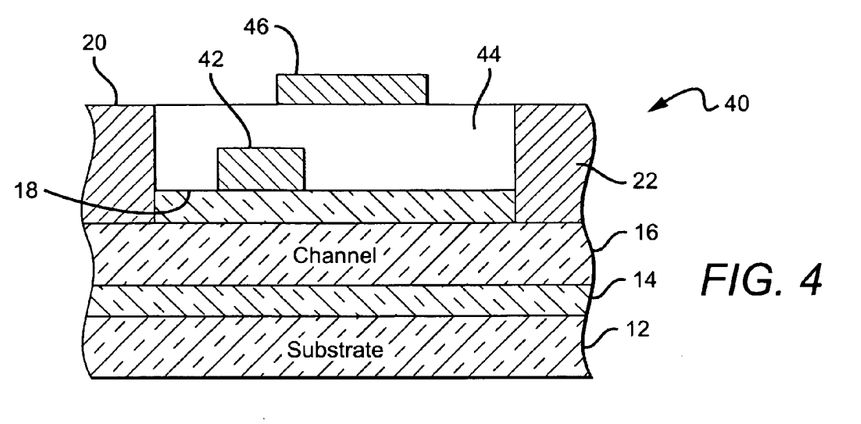
FIG. 4 is a sectional view of the HEMT in FIG. 3.

FIGS. 3 and 4 show another embodiment of a HEMT 40 according to the present invention that is similar to the HEMT 10 in FIGS. 1 and 2. For the same or similar features for the HEMT 40 in FIGS. 3 and 4 the same reference numerals from FIGS. 1 and 2 will be used. The HEMT 40 comprises a substrate 12, nucleation layer 14, channel 16, barrier layer 18, source contact 20, and drain contact 22. A gate 42 is formed after formation of the barrier layer 18. A passivation layer 44 is then formed on the device and particularly over the gate 42 and the surface of the barrier layer between the gate 42 and the source and drain contacts 20, 22. A field plate 46 is then formed on the passivation layer 44 overlapping the gate 42 and extending a distance $L_f$ in the gate-drain region. In the embodiment shown in FIGS. 3 and 4, the passivation layer 44 serves as a spacer layer for the filed plate 46. The overlap of the field plate 46 over the gate 42 and the distance $L_f$ can be varied for optimum results.

The field plate 46 can be electrically connected to gate 42 and FIG. 3 shows two alternative gate connection structures that can be used, although it is understood that other connection structures can also be used. The field plate 46 can be connected to the gate 42 through a first conductive path 48 running outside the active area of the HEMT 40 to a gate contact 50 that is used to make electrical contact to the gate 42. A second conductive path 52 (shown in phantom) can also be used that runs outside of the active region of the HEMT 40 on the side opposite the gate contact 50. The conductive path 52 is coupled between the gate 42 and the field plate 46. Conductive vias (not shown) can also be used to connect the field plate 46 to the gate 42, with each vias running between the two through the passivation layer 44. The vias can be arranged periodically down the field plate 46 to provide for effective current spreading from the gate 42 to the field plate 46.

In some embodiments, the field plate 46 can extend a distance $L_f$ of 0.2 to 1 µm. In some embodiments, the field plate 46 can extend a distance $L_f$ of 0.5 to 0.9 µm. In preferred embodiments, the field plate 46 can extend a distance $L_f$ of approximately 0.7 µm.

Figure 5:
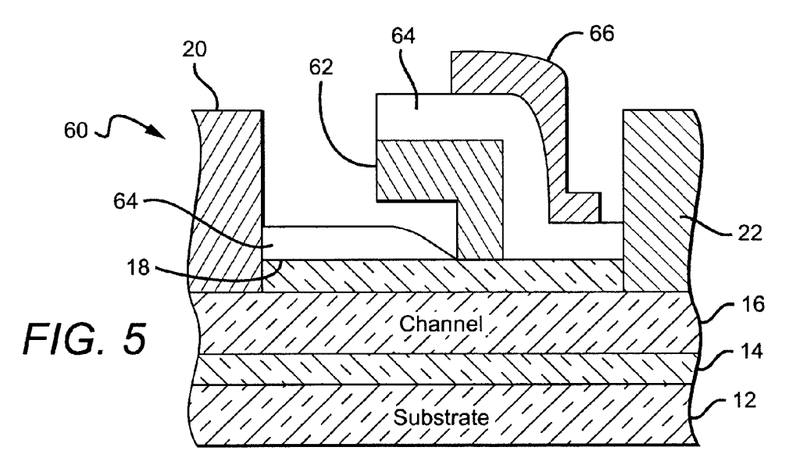
FIG. 5 is a sectional view of another embodiment of a HEMT according to the present invention.

FIG. 5 shows another embodiment of a HEMT 60 according to the present invention that has many features similar to those in HEMTs 10 and 40, including a substrate 12, nucleation layer 14, channel layer 16, barrier layer 18, source contact 20, and drain contact 22. HEMT 60, however, has a gamma (Γ) shaped gate 62 that is particularly adapted to high frequency operation. The gate length generally determines the speed of the device and typical gate contacts lead to high resistance that negatively impacts high frequency operation. T-gates are commonly used in high frequency operation, but it can be difficult to achieve a well-coupled placement of a field plate on a T-gate.

The gamma gate 62 provides for low gate resistance and allows for controlled definition of the gate footprint. A spacer/passivation layer 64 is included that covers the gamma gate 62 and the surface of barrier layer 18 between the gamma gate 62 and the source and drain contacts 20, 22. A space can remain between the horizontal portion of the gamma gate 62 and the top of the spacer layer. The HEMT 60 also includes a field plate 66 on the spacer layer 64 that overlaps that gamma gate 62, with the field plate 66 preferably deposited on the side of the gamma gate not having a horizontal overhanging section. The arrangement allows for tight placement and effective coupling between the gate and the field plate.

Like the field plate 46 shown in FIGS. 3 and 4 and described above, the field plate 66 can be connected to the gate 62 in many different ways. A first conductive path (not shown) can be included between the field plate 66 and the gate contact or a second conductive path (not shown) can be included between field plate 66 and the gate 62, with both the conductive paths being outside the active area of the HEMT. Conductive vias can also be used between the field plate 66 and gate 62 that pass through the spacer layer 64.

Figure 6:
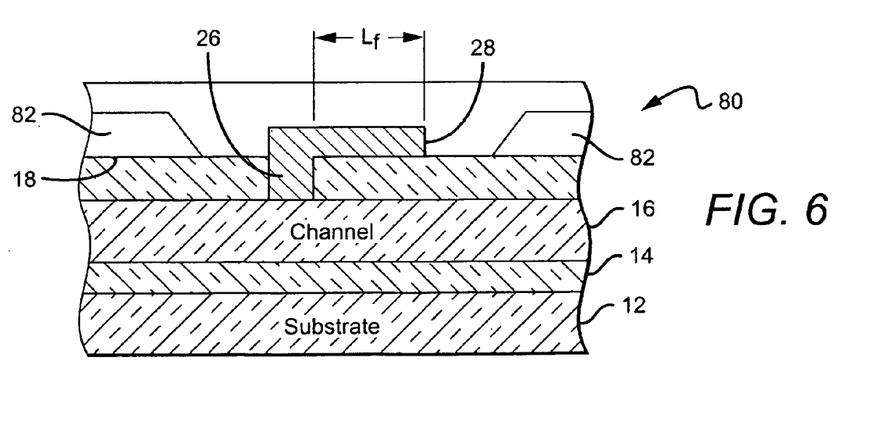
FIG. 6 is a sectional view of still another embodiment of a HEMT according to the present invention.

FIG. 6 shows still another embodiment of a HEMT 80 according to the present invention that is similar to HEMT 10 shown in FIG. 1. It comprises a substrate 12, nucleation layer 14, channel 16, barrier layer 18, source contact 20, drain contact 22, spacer layer 24, and gate 26 with a field plate structure 28. The HEMT 80 also includes a doped n$^+$ contact layer 82 formed on the spacer layer 24. Prior to formation of gate contact 26, contact layer 82 is etched to reveal a portion of the surface of spacer layer 20. Source and drain contacts (not shown) are formed on contact layer 82. Contact layer 82 facilitates formation of ohmic source and drain contacts as well as providing low access region resistances.

Figure 7:
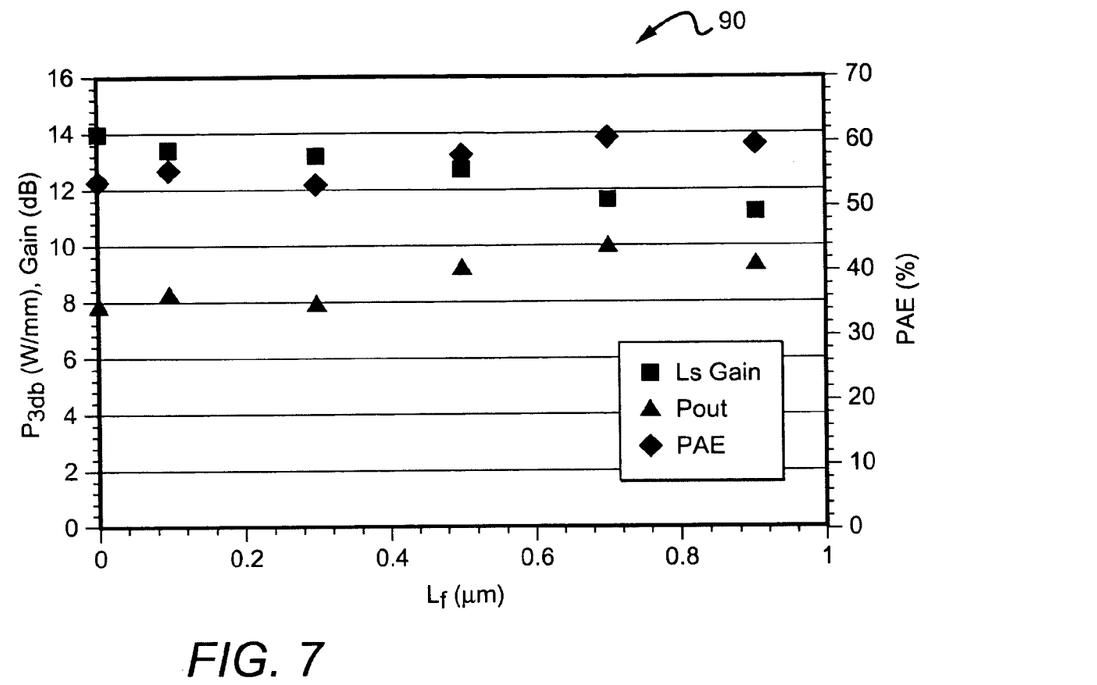

A GaN-based HEMT structure in accordance with the embodiment of FIGS. 3 and 4 was constructed and tested, with the results of the testing shown in the graph 90 of FIG. 7. Initial testing showed a power density of 20.4 W/mm with 51% Power Added Efficiency (PAE) operating in class B at 82V and 4 GHz. More recent testing has achieved improved performance with a power density of 32 W/mm with 55% PAE at 120V and 4 Ghz.

The effect of field plate distance ($L_f$) on device performance was tested. The field plate length $L_f$ was varied from a distance of 0 to 0.9 µm and the PAE of the resulting devices was then measured. As illustrated in FIG. 7, the PAE showed improvement once the field plate length was extended to 0.5 µm, with an optimum length of about 0.7 µm. However, the optimum length may depend on the specific device design as well as operating voltage and frequency.

Figure 8:
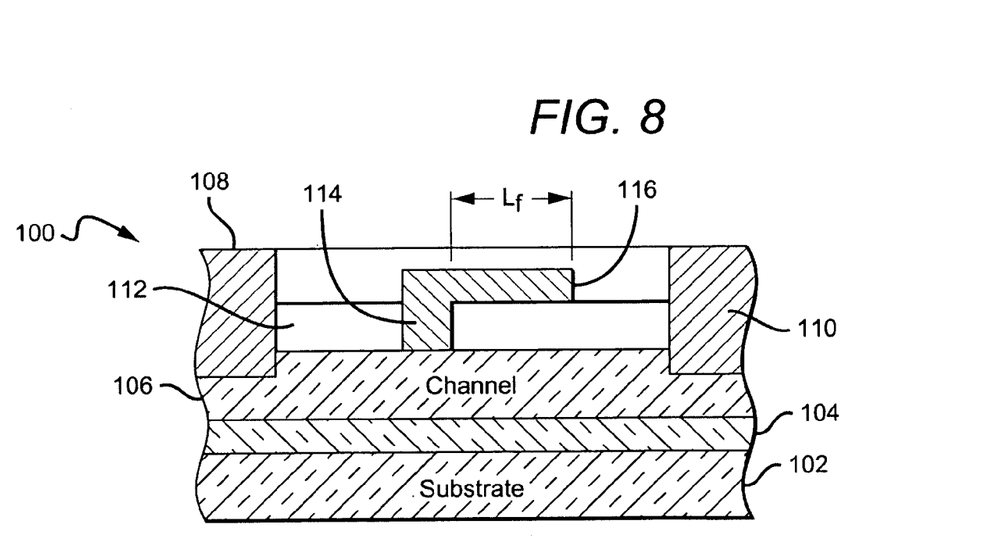
FIG. 8 is a sectional view of one embodiment of a MESFET according to the present invention.

Other types of transistors with field plates can also be used in cascode circuits according to the present invention. FIG. 8 shows one embodiment of a metal semiconductor field effect transistor (MESFET) 100 that can be used in a cascode type circuit according to the present invention. MESFET 100 is preferably silicon carbide based although MESFETs of other material systems can also be used. MESFET 100 comprises a silicon carbide substrate 102 on which a silicon carbide buffer 104 and a silicon carbide channel layer 106 are formed with the buffer 104 sandwiched between the channel layer 106 and substrate 102. Source and drain contacts 108, 110 are formed in contact with the channel layer 106.

A non-conducting spacer layer 112 is formed on the channel layer 106, between the source and drain contacts. Similar to the spacer layer 24 described above and shown in FIGS. 1 and 2, the spacer layer 112 can comprise a layer of non-conducting material such as a dielectric, or a number of different layers of non-conducting materials such as different dielectrics.

Also similar to the spacer layer 24 in FIGS. 1 and 2, the spacer layer 112 can be etched to the channel layer 76 and a gate electrode 114 can be deposited such that the bottom of the gate 114 is on the surface of channel layer 106. The metal forming the gate 114 can be patterned to extend across spacer layer 112 so that the top of the gate 114 forms a field plate structure 116 extending a distance $L_f$ away from the edge of gate 114 towards drain contact 110. Finally, the structure can be covered with a dielectric passivation layer 118 such as silicon nitride.

The fabrication of silicon carbide based MESFET devices is described in more detail in U.S. Pat. No. 5,686,737 and U.S. patent application Ser. No. 09/567,717 filed May 10, 2000 entitled "Silicon Carbide Metal-Semiconductor Field Effect Transistors and Methods of Fabricating Silicon Carbide Metal-Semiconductor Field Effect Transistors" each of which is incorporated herein by reference in its entirety.

Figure 9:
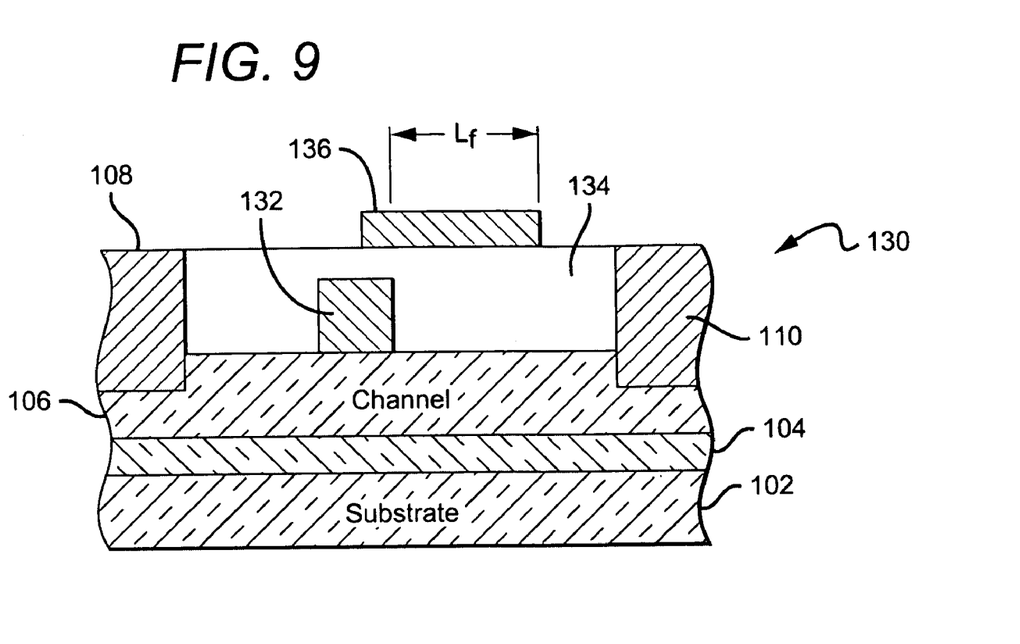
FIG. 9 is a sectional view of another embodiment of a MESFET according to the present invention.

FIG. 9 shows another embodiment of a MESFET 130 that is similar to MESFET 100 but has a gate and field plate structure similar to that in the HEMT 40 shown in FIGS. 3 and 4. MESFET 130 comprises a silicon carbide substrate 102, buffer 104, and channel 106. It also comprises a source contact 108, drain contact 110, and a gate 132 deposited on the channel 106. A passivation layer 134 is deposited over the gate 132 and on the surface of the channel between the gate 132 and the source and drain contacts 108, 110. A field plate 136 is deposited on the passivation layer 134 and overlaps the gate 132. The field plate 136 is coupled to the gate 132 by a conductive path and many different conductive paths can be used including a first conductive path to the gate contact (not shown) or a second conductive path (not shown) to the gate 132, both of which run outside of the MESFET active area. The field 136 can also be coupled to the gate 132 by conductive vias (not shown) through the passivation layer 134.

It is understood that the HEMTs and MESFETs described above are only some of the field plated transistors that can be used in amplifier circuits according to the present invention. Other transistors can have a field plate that is coupled to the source contact, or can have multiple field plates. The devices can also be arranged with field plates that are at least partially recessed in the HEMT or MESFET semiconductor layers.

Providing one or more field plates in a transistor in accordance with aspects of the invention can result in a reduction of the electric field strength within the device which allows for higher voltage and lower trapping operation, and can result in very high power performance. However, the extra capacitance (e.g. feedback) added by the field plate may reduce the overall gain of the transistor, which can reduce gain and can negatively impact PAE at mm-wave frequencies.

To address this problem according to the present invention, a cascode amplifier circuit is provided having at least two stages wherein an initial stage does not suffer from feedback capacitance and a later downstream field plated stage is arranged in such a way that any added capacitance from a field plate only minimally impacts performance. The cascode amplifier comprises a high-gain, low-noise, high-input-impedance amplifier circuit comprising a grounded electron-emitter input stage coupled directly to a grounded-control-electrode stage.

A 2-stage cascode amplifier structure (or amplification block) in accordance with embodiments of the invention includes a first stage transistor connected in common source configuration and a second stage field-plated transistor connected in common gate configuration. The first stage is arranged to provide current gain and does not "see" high voltages, while the second field plated stage does see high voltages and is arranged to provide voltage gain.

The first stage transistor can comprise a wide bandgap field effect transistor such as a GaN-based HEMT structure or a SiC MESFET. The second stage transistor may comprise a wide bandgap field effect transistor structure such as a GaN-based HEMT or a SiC MESFET having a field plate extending above a spacer layer from the edge of the gate contact towards the drain contact in the manner described in the HEMTs and MESFETs described above. It is understood, however, that other transistors with other field plate arrangements can also be used in cascode amplifier circuits according to the present invention. Accordingly, embodiments of the invention provide a multi-stage transistor amplification block in which the gain is realized from a first stage field effect transistor that does not include a field plate.

Figure 10:
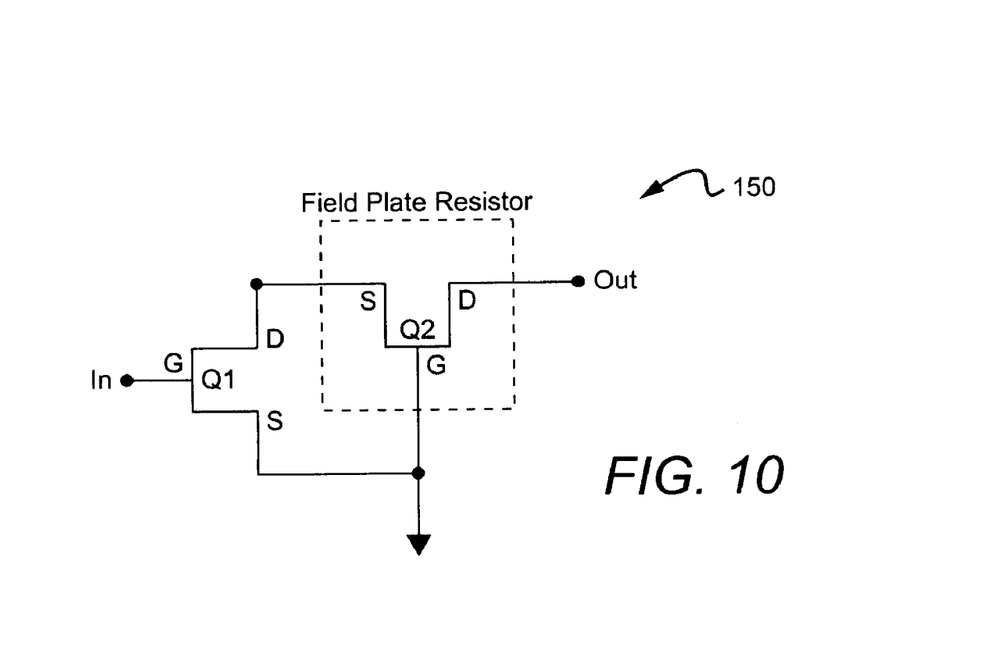
FIG. 10 is schematic of one embodiment of a multi-stage amplifier block according to the present invention.

FIG. 10 shows one embodiment of a multi-stage transistor amplifier block 150 according to the present invention that includes a first stage transistor Q1 and a second stage transistor Q2, each of which may comprise a wide-bandgap field effect transistor. (For simplicity, only the amplifier signal chain is illustrated; bias and matching networks are not shown. The design of such networks is well known to those skilled in the art.) The first stage amplifier Q1 is connected in a common-source configuration. The input of the amplifier block 150 is provided to the gate of Q1, while the drain of Q1 is connected to the source of the second stage transistor Q2 (that is, it is grounded). The output of the amplifier block 150 is taken from the drain of the second stage transistor Q2.

Since the maximum voltage that can appear on the drain of the first stage transistor Q1 is the threshold voltage of the second stage transistor Q2, the first stage transistor Q1 does not "see" high voltages or high electric fields and hence would not benefit from a field plate. Moreover, since the first stage amplifier Q1 does not include a field plate, it does not experience the increased capacitance associated with a field plate, thereby permitting higher gain at its operating frequency.

Higher breakdown voltage and higher power operation is enabled by the second stage transistor Q2 (or subsequent stages) which includes a field plate to reduce the electric field within the device. Hence the multi-stage amplification block 100 obtains the benefits of the field plate without detrimental impact on the overall gain of the amplifier block. Stated differently, any field plate capacitance shows up at output capacitance in the second stage instead of feedback capacitance, which can significantly improve gain. Q1 can be biased at a low voltage (−6V) and provides current gain, while Q2 is biased at a high voltage and generates voltage gain. Non-field-plate devices are more suited to lower voltage operation (where dispersion is not a problem), while field plated devices are more suited to high bias operation. Multi-stage amplifier blocks according to the present invention combine the strengths of both these devices.

Embodiments of the invention may be useful in the mm-wave frequency regime wherein the first stage transistor has a very short gate length enabling higher frequency operation with maximum gain. The second stage transistor comprises a field plate to enable higher voltage and higher power operation.

It is understood that many different amplifier arrangements can be used according to the present invention. One alternative arrangement comprises a single transistor with a dual gate structure.

Although the present invention has been described in considerable detail with reference to certain preferred configurations thereof, other versions are possible. The field plate arrangement can be used in many different devices. The field plates can also have many different shapes and can be connected to the source contact in many different ways. The amplifier blocks can be arranged in many different ways and with more than two stages. Accordingly, the spirit and scope of the invention should not be limited to the preferred versions of the invention described above.

We claim:

1. A multi-stage amplifier block, comprising:
   a first stage transistor arranged to provide current gain; and
   a second stage common gate transistor having a field plate, said first transistor coupled to said second transistor with said second transistor providing voltage gain,
   wherein said field plate is electrically connected to the gate of said second transistor, said field plate at least partially overlapping said gate and extending toward the drain of said second transistor.

2. The amplifier block of claim 1, wherein said field plate is arranged to reduce the electric field strength within said second transistor during operation.

3. The amplifier block of claim 1, wherein said first stage transistor is common source configured.

4. The amplifier block of claim 1, wherein said second stage transistor is common gate configured.

5. The amplifier of claim 1, wherein the drain of said first stage transistor is connected to the source of said second stage transistor.

6. The amplifier of claim 1, wherein the drain of said second stage transistor is the output of said amplifier block.

7. The amplifier of claim 1, wherein the gate of said first stage transistor is the input to said amplifier block.

8. The amplifier of claim 1, wherein the first stage transistor comprises a transistor from the group consisting of a high electron mobility transistor (HEMT) and a metal semiconductor field effect transistor (MESFET).

9. The amplifier of claim 1, wherein said second stage transistor comprises a transistor from the group consisting of a high electron mobility transistor (HEMT) and a metal semiconductor field effect transistor (MESFET).

10. A multi-stage amplifier block, comprising:
    a first stage transistor arranged to provide current gain;
    a second stage transistor having a field plate, said first transistor coupled to said second transistor with said second transistor providing voltage gain,
    wherein said field plate is electrically connected to the gate of said second transistor,
    wherein said second stage transistor further comprises a passivation layer covering said gate, said field plate arranged on said passivation layer overlapping said gate and extending from the edge of the gate towards the drain contact.

11. A multistage amplifier block, comprising:
    a first stage transistor arranged to provide current gain;
    a second stage transistor having a field plate, said first transistor coupled to said second transistor with said second transistor providing voltage gain,
    wherein said field plate is electrically connected to the gate of said second transistor,
    wherein said second stage transistor comprises a HEMT having a channel layer and a barrier layer, and further comprises a spacer layer on the surface of said barrier layer with said barrier layer sandwiched between said channel and spacer layers, said gate passing through said spacer layer and contacting said barrier layer, and said field plate arranged on the surface of said spacer layer in contact with said gate.

12. A multistage amplifier block, comprising:
    a first stage transistor arranged to provide current gain;
    a second stage transistor having a field plate, said first transistor coupled to said second transistor with said second transistor providing voltage gain,
    wherein said field plate is electrically connected to the gate of said second transistor,
    wherein said second stage transistor comprises a HEMT having a channel layer and barrier layer, and said gate is gamma shaped and is in contact with said barrier layer, said HEMT further comprising a spacer layer that at least partially covers said gamma gate, said field plate arranged on said spacer layer and at least partially overlapping said gate.

13. A multi-stage amplifier block, comprising:
    a first stage transistor arranged to provide current gain;
    a second stage transistor having a field plate, said first transistor coupled to said second transistor with said second transistor providing voltage gain,
    wherein said field plate is electrically connected to the gate of said second transistor,
    wherein said second stage transistor comprises a MESFET having a channel layer, and further comprises a spacer layer on the surface of said channel layer, said gate passing through said spacer layer and contacting said barrier layer, and said field plate arranged on the surface of said spacer layer in contact with said gate.

14. A multi-stage amplifier, comprising:
    a non-field-plate transistor; and
    a field-plate transistor having at least one field plate arranged to reduce the electric field strength within said field plate transistor during operation, said nonfield plate transistor connected to said field plate transistor, wherein said field plate at least partially overlaps the gate of said field-plate transistor and extends toward the drain of said field-plate transistor.

15. The amplifier of claim 14, wherein said non-field-plate transistor is arranged to provide current gain to a signal and said field plate transistor is arranged to provide voltage gain to said signal.

16. The amplifier of claim 14, wherein said non-field-plate is common source configured and said field plate transistor is common gate configured.

17. The amplifier of claim 14, wherein said nonfield-plate transistor is arranged to accept a signal at its gate and provide a current amplified signal at its drain.

18. The amplifier of claim 17, wherein said field plate transistor is arranged to accept said current amplified signal at its source and provide a voltage amplified signal at its drain.

19. The amplifier of claim 14, wherein said non-fieldplate and field plate transistors are each a high electron mobility transistor (HEMT) or metal semiconductor field effect transistor (MESFET).

20. An amplifier circuit, comprising:
a first transistor having a common source configuration and arranged to accept a signal at its gate and provide a current amplified signal at its drain; and
a second transistor having a common gate configuration and arranged to accept said current amplified signal at its source and provide a voltage amplified signal at its drain, said second transistor comprising a field plate at least partially overlapping the gate of said second transistor and extending toward the drain of said second transistor.

21. The circuit of claim 20, wherein said field plate is electrically connected to the gate of said second transistor.

22. The circuit of claim 20, wherein said first transistor is substantially free of feedback capacitance and its gate input.

23. The circuit of claim 20, wherein said second transistor is substantially free of feedback capacitance at its source input.

* * * * *